United States Patent
Beatson et al.

(10) Patent No.: US 6,778,274 B2
(45) Date of Patent: Aug. 17, 2004

(54) DIE ATTACH PROCESS USING CORNERCUBE OFFSET TOOL

(75) Inventors: David T. Beatson, Kennett Square, PA (US); Christian Hoffman, Willow Grove, PA (US); James E. Eder, Doylestown, PA (US); Jonn Ditri, Huntingdon Valley, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 10/620,036

(22) Filed: Jul. 15, 2003

(65) Prior Publication Data

US 2004/0012784 A1 Jan. 22, 2004

Related U.S. Application Data

(60) Division of application No. 10/075,899, filed on Feb. 14, 2002, which is a continuation-in-part of application No. 09/912,024, filed on Jul. 24, 2001, now Pat. No. 6,412,683.

(51) Int. Cl.[7] .............................................. G01B 11/00
(52) U.S. Cl. ...................................... 356/399; 356/400
(58) Field of Search ............................... 356/399–401, 356/613–616, 620–622, 453, 454, 510, 301; 228/9–11, 103, 105

(56) References Cited

U.S. PATENT DOCUMENTS

| | | |
|---|---|---|
| 3,072,011 A | 1/1963 | Hemstreet et al. |
| 3,485,547 A | 12/1969 | Bougon et al. |
| 3,601,490 A | 8/1971 | Erickson |
| 3,853,404 A | 12/1974 | Barrett |
| 3,865,467 A | 2/1975 | Von Thuna |
| 3,999,854 A | 12/1976 | Barrett |
| 4,005,937 A | 2/1977 | Barrett |
| 4,325,638 A | 4/1982 | Takeda et al. |
| 5,408,189 A * | 4/1995 | Swart et al. ................ 324/758 |
| 5,566,877 A | 10/1996 | McCormack |
| 5,581,632 A | 12/1996 | Koljonen et al. |
| 5,640,199 A | 6/1997 | Garakani et al. |
| 5,702,049 A | 12/1997 | Biggs et al. |
| 5,760,905 A | 6/1998 | Sasagawa |
| 5,861,909 A | 1/1999 | Garakani et al. |
| 5,991,436 A | 11/1999 | Koljonen et al. |
| 6,118,540 A | 9/2000 | Roy et al. |
| 6,341,014 B1 | 1/2002 | Maurel et al. |
| 6,470,114 B1 | 10/2002 | Koth |

* cited by examiner

Primary Examiner—Zandra V. Smith
Assistant Examiner—Gordon J. Stock, Jr.
(74) Attorney, Agent, or Firm—RatnerPrestia

(57) ABSTRACT

A system and method having applications in semiconductor areas for accurate die placement on a substrate that takes into account any positional offset from the reference position due to variations caused by thermal change and other nonrandom systemic effects. The system includes an offset alignment tool having a plurality of internal reflection surfaces and located below a vision plane of the substrate, and an optical detector to receive an indirect image of a bottom surface of the die through the alignment tool, such that the die is accurately positioned on the substrate based on the indirect image received by the optical detector. The method comprises the steps of providing a cornercube offset alignment tool having a plurality of total internal reflection surfaces below a vision plane of the die, and receiving an indirect image of the die tool through the cornercube offset tool.

3 Claims, 12 Drawing Sheets

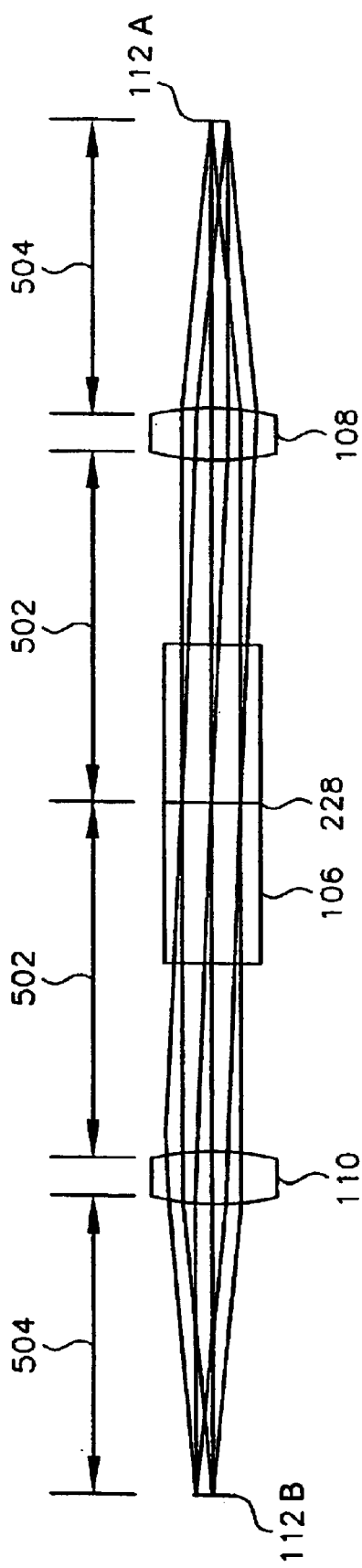
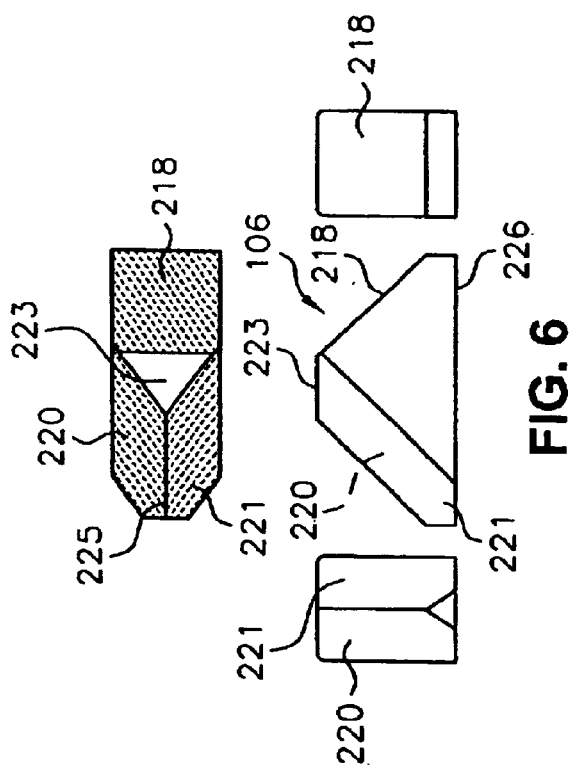

DIE ATTACH PROCESS USING CORNERCUBE OFFSET TOOL

This Application is a divisional of U.S. patent application Ser. No. 10/075,899, filed Feb. 14, 2002, which is a continuation-in-part application of U.S. patent application Ser. No. 09/912,024, filed Jul. 24, 2001, which is now U.S. Pat. No. 6,412,683, issued Jul. 2, 2002.

FIELD OF THE INVENTION

This invention relates generally to the use of machine vision systems for semiconductor chip bonding/attaching devices. More specifically, the present invention relates to the use of a corner cube retro-reflector as an offset alignment tool that acquires indirect images of the bonding target during the die attach process when the same lie outside the view of the imaging system. From such images, coordinate information on position can be obtained and any positional offset from a reference position of the die bonding tool or die placement tool due to deviations caused by thermal change or other nonrandom systemic errors can be taken into account for correct alignment of wire bonding, die placement or fiber placement tools.

BACKGROUND OF THE INVENTION

Semiconductor devices, such as integrated circuit chips, are electrically connected to the leads on a lead frame by a process known as wire bonding. The wire bonding operation involves placing and connecting a wire to electrically connect a pad (first bond) residing on the semiconductor die to a lead (second bond) in a lead frame. Both the first and the second bonds have to be placed accurately as dictated by requirements of the package. Once all the appropriate pads on the chip have been wire bonded to the appropriate leads on the lead frame, it can be packaged, often in ceramic or plastic, to form an integrated circuit device. In a typical application, a die or chip may have hundreds or thousands of pads and leads that need to be connected.

There are many types of wire bonding equipment. Some use thermal bonding, some use ultra-sonic bonding and some use a combination of both. Prior to bonding, vision systems or image processing systems (systems that capture images, digitize them and use a computer to perform image analysis) are used on wire bonding machines to align devices and guide the machine for correct bonding placement.

In conventional systems, post attach inspection is used to determine if relative changes in bonding or die placement tool position are necessary to effect proper and accurate placement of die or wire bonds. As such, these conventional systems can only compensate for improper wire bonds or improper die placement after such improper wire bonds or improper die placement actions occur, thereby negatively effecting device yield and machine throughput. These conventional systems have additional drawbacks in that they are unable to easily compensate for variations in the system due to thermal changes, for example. These changes require periodic inspection of completed devices further impacting device yield and negatively impacting manufacturing time.

In conventional systems the vision system (shown in FIG. 11) consists of two image devices, a first image device 1104 placed below work piece plane 1112 and upwardly viewing objects and a second image device 1102 placed above workplace plane 1112 and downwardly viewing objects. These conventional systems have drawbacks in that in addition to requiring more than one image device, they are unable to easily compensate for variations in the system due to thermal changes, for example.

SUMMARY OF THE INVENTION

In view of the shortcomings of the prior art, it is an object of the present invention to provide a method for attaching an integrated circuit die to an underlying substrate using vision system that takes into account variations due to temperature changes and other nonrandom systemic effects.

The present invention is a vision system for use with a semiconductor fabrication machine for accurate die alignment and die placement. The system comprises an alignment tool having a plurality of internal reflection surfaces, the alignment tool located below an object plane of the substrate (or other workpiece); and an optical detector to receive an indirect image of a bottom surface of the substrate through the alignment tool.

According to another aspect of the invention, the vertex of the alignment tool is located at a position about midway between an optical axis of the optical detector and an optical axis of the die.

According to a further aspect of the invention, the alignment tool comprises a plurality of cornercube offset tools.

According to still another aspect of the invention, the focal plane of the vision system is positioned at or above the alignment tool.

According to yet another aspect of the present invention, the system includes a lens positioned between the alignment tool, and i) the optical detector and ii) the die.

According to still another aspect of the present invention, the system includes a first lens positioned between the optical detector and the alignment tool and a second lens positioned between the die and the alignment tool.

According to a further aspect of the present invention, the first lens and the second lens are located at or below the object plane.

According to another aspect of the present invention, the first lens and the second lens are located in line with the vision plane.

According to yet a further aspect of the present invention, the reflecting surfaces are three mutually perpendicular faces.

According to yet another aspect of the present invention, the angle between each of the internal reflective surfaces and the top surface of the corner cube offset tool is about 45°.

According to still another aspect of the invention, the optical detector is a CCD camera.

According to yet another aspect of the invention, the optical detector is a CMOS imager.

According to yet a further aspect of the invention, the optical detector is a position sensitive detector.

According to an exemplary method of the present invention, a cornercube offset tool is positioned below a workplace plane of the die; a lens is positioned between i) the die and the cornercube offset tool and ii) between an optical imager and the cornercube offset tool; and the die is viewed indirectly through the cornercube offset tool and the lens.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIG. 5 illustrates the telecentricity of an exemplary embodiment of the present invention;

FIG. 6 is a detailed view of an exemplary retroreflective cornercube offset tool according to the present invention;

DETAILED DESCRIPTION

Figure 1:
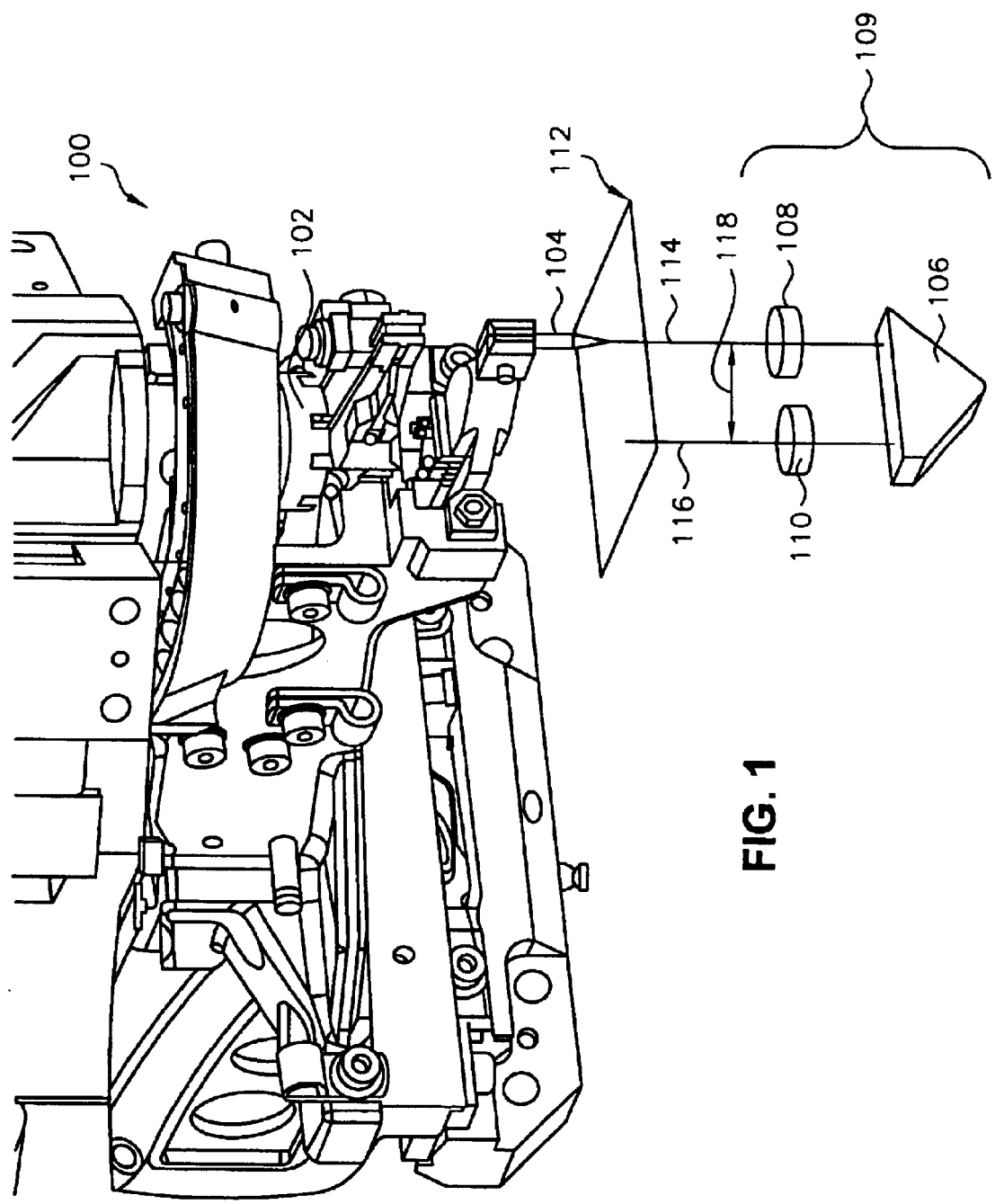
FIG. 1 is a perspective view of an exemplary embodiment of the present invention.

The entire disclosure of U.S. patent application Ser. No. 09/912,024 filed on Jul. 24, 2001 is expressly incorporated by reference herein Referring to FIG. 1 a perspective view of an exemplary embodiment of the present invention is shown. The system is included in wire bonding machine 100, and employs a cornercube 106, having a plurality of Internal reflection surfaces (best shown in FIG. 6), located at or below object plane 112A of bonding tool 104.

In an exemplary embodiment, cornercube offset alignment tool 109 (comprising cornercube 106 and lens elements 108, 110), has a total of three internal reflection surfaces, 218, 220, and 221 (best shown in FIG. 6 and described below). In another exemplary embodiment, cornercube 106 may have a plurality of total internal reflective surfaces. In one exemplary embodiment, cornercube 106 is formed from fused silica, sapphire, diamond, calcium fluoride or other optical glass. Note, optical quality glass, such as BK7 made by Schott Glass Technologies of Duryea, Pa., may also be used. Note also, that materials for cornercube 106 can be selected for maximum transmission with respect to the desired operating wavelength.

Optical imaging unit 102, such as a CCD imager, CMOS imager, or a camera, for example, is mounted above Image plane 112B in order to receive an indirect image of bonding tool 104 through cornercube offset alignment tool 109. In another exemplary embodiment, a position sensitive detector (PSD), such as that manufactured by Ionwerks Inc., of Houston, Tex., may also be used as optical imaging unit 102.

In such an embodiment, when the hole in bonding tool 104 is illuminated, such as by using an optical fiber for example, the PSD can be utilized to record the position of the spot of light exiting bonding tool 104. It is also contemplated that the PSD may be quad cell or bi-cell detector, as desired.

In the exemplary embodiment, the focal point of the vision system (coincident with imaginary plane 211 shown in FIG. 2A) is located above bottom surface 223 (shown in FIG. 2A) of cornercube 106. In addition, the exemplary embodiment includes two preferably identical lens elements 108, 110 located at or below object plane 112A and image plane 112B. Another embodiment, shown in FIG. 2B, includes a single lens element 205 located below object plane 112A and image plane 112B and in line with optical axes 114, 116. Hereinafter, the combination of cornercube 106, and lens elements 108, 110 (or lens element 205) will be referred to as assembly 109.

The image plane of cornercube 106, including lens elements 108, 110, is coincident with the object plane 112B of optical imaging unit 102. In other words, the image plane of cornercube 106 and lens elements 108, 110 are aligned to bonding tool 104 which also lies in object plane 112A. In the exemplary embodiment, lens elements 108, 110 (or 205) preferably have a unitary magnification factor. First lens element 108 is positioned in a first optical axis 114 between bonding tool 104 and cornercube 106. Second lens element 110 Is substantially In the same plane as that of first lens element 108 and is positioned in a second optical axis 116 between optical imaging unit 102 and cornercube 106. In one exemplary embodiment, first and second optical axes 114 and 116 are substantially parallel to one another, and are spaced apart from on another based on specific design considerations of bonding machine 100. In one exemplary embodiment the distance 118 between first optical axis 114 and second optical axis 116 is about 0.400 in. (10.160 mm.) although distance 118 may be as small as about 0.100 in. (2.54 mm) depending on design considerations related to the bonding machine.

Figure 2A:
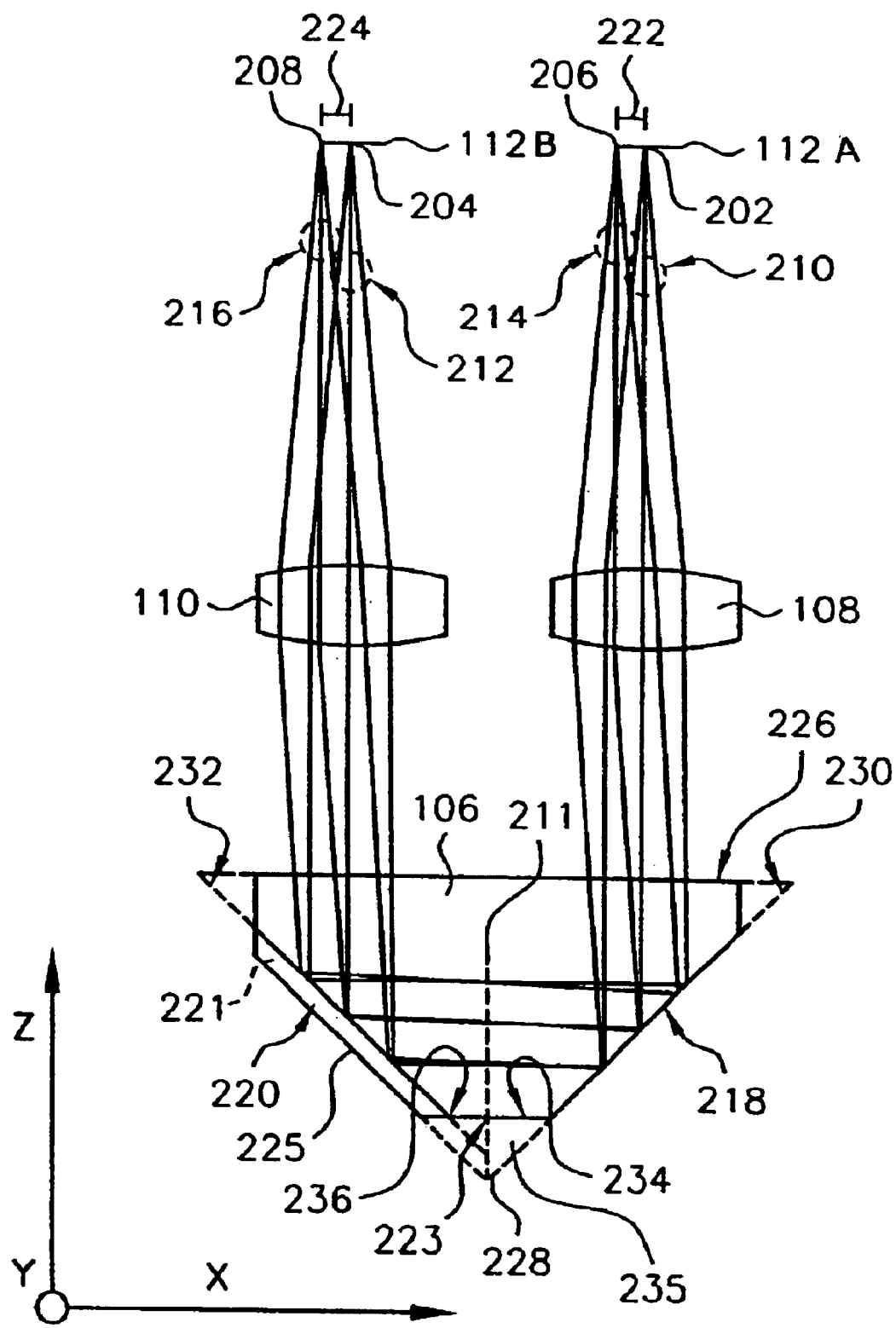
FIG. 2A is a side view of image ray traces according to a first exemplary embodiment of the present invention.
Figure 2B:
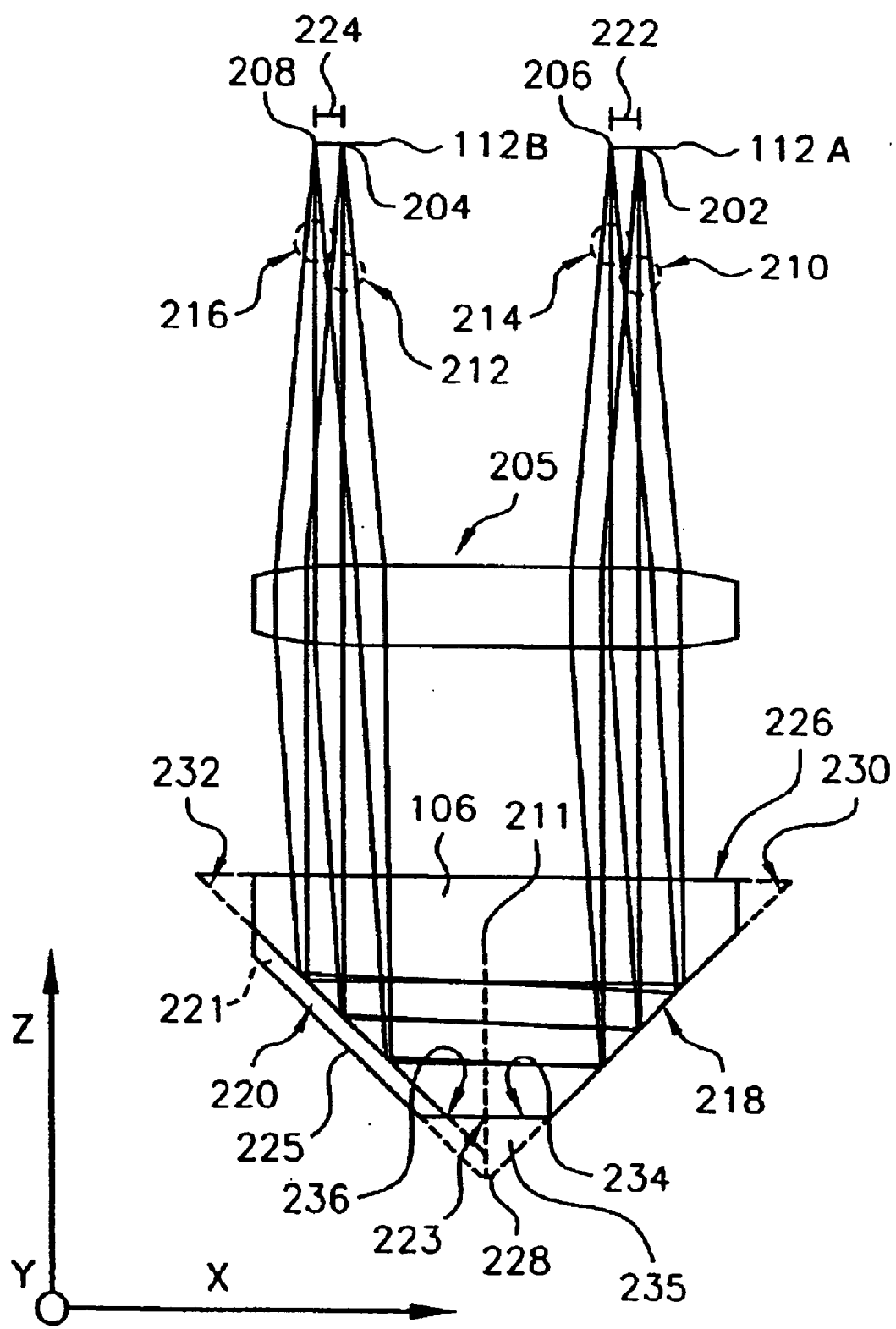
FIG. 2B is a side view of image ray traces according to a second exemplary embodiment of the present invention.

FIG. 2A is a detailed side view of image ray traces and illustrates the general imaging concept of an exemplary embodiment of the present invention. In FIG. 2A, exemplary ray traces 210, 214 are separated for clarity to illustrate the relative immunity of the resultant image due to positional changes. The same distance also separates the image points because lens elements 108, 110 serve as unitary magnification relays. FIG. 2A also demonstrates how changes in the bonding tool 104 position are compensated for. For example, once conventional methods have been used to accurately measure the distance between imaging unit 102 and bonding tool 104 (shown in FIG. 1), the present invention is able to compensate for changes in the bonding tool 104 (or pick/place tool 114 discussed below with reference to FIG. 10A) offset position 222 due to changes in the system. The location of bonding tool 104 can be accurately measured because cornercube 106 images bonding tool 104 onto image plane 112B of the optical system (not shown in this figure).

The reference position of bonding tool 104 is shown as a reflected ray which travels from first position 202 along first optical axis 114 (shown in FIG. 1), as direct image ray bundle 210 from first position 202 through first lens element 108. Direct Image ray bundle 210 continues along first optical axis 114 where it then passes through top surface 226 of cornercube 106 onto first internal reflection surface 218. Direct image ray bundle 210 is then reflected onto second internal reflection surface 220, which In turn directs It onto third internal reflective surface 221 (best shown in FIG. 3).

Next, direct image ray bundle 210 travels back through top surface 226 of cornercube 106 as reflected image ray bundle 212 along the second optical axis 116 (shown in FIG. 1) and through second lens element 110 to image plane 112B. It is reflected image ray bundle 212 that is detected by imaging unit 102 as image 204.

Consider now that the position of bonding tool 104 is displaced by a distance 222 due to a variation in system temperature, for example. As shown in FIG. 2A, the displaced image of bonding tool 104 is shown as position 206 and imaged along the path of second position ray trace 214. As shown in FIG. 2A, direct image ray bundle 214 travels along a path similar to that of direct image ray bundle 210 from first position 202. Second position 206 image travels as a direct image ray bundle 214, through first lens element 108. Direct image ray bundle 214 then passes through top surface 226 of cornercube 106 onto first internal reflection surface 218. Direct image ray bundle 214 is then reflected onto second internal reflection surface 220, which in turn directs It onto third internal reflection surface 221 (best shown in FIG. 3). Next, direct image ray bundle 214 travels through top surface 226 of cornercube 106 as reflected image ray bundle 216 and through second lens element 110 to image plane 112B. Reflected image ray bundle 216 is viewed as a reflected image by imaging unit 102 as being in second position 208. Although the above example was described based on positional changes along the X axis, it is equally applicable to changes along the Y axis.

As illustrated, the original displacement of bonding tool 104, shown as offset position 222, is evidenced by the difference 224 in the measured location of bonding tool 104 at second position 208 with respect to reference location 204. As evidenced by the above illustration, a positional shift in assembly 109 does not affect the reflected image as viewed by imaging unit 102. In other words, assembly 109 of the present invention may be translated along one or both the X and Y axes such that the image of the bonding tool 104 appears relatively stationary to imaging unit 102. There will be some minimal degree of error, however, in the measured position of bonding tool 104 due to distortion in the lens system (discussed in detail below).

Referring again to FIG. 2A, vertex 228 (shown in phantom) of cornercube offset alignment tool 109 is located at a position approximately midway between first optical axis 114 and second optical axis 116. To facilitate mounting of cornercube 106, a lower portion 235 of the cornercube may be removed providing bottom surface 223, which may be substantially parallel to top surface 226. Removal of lower portion 235 does not affect the reflection of image rays since the image rays emanating from object plane 112A do not impinge upon bottom surface 223.

Exemplary cornercube 106 comprises top surface 226, first reflective surface 218, bottom surface 223, second reflective surface 220, and third reflective surface 221. If top surface 226 is set such that optical axes 114, 116 are normal to top surface 226, first reflective surface 218 will have a first angle 230 of about 45° relative to top surface 226, and a second angle 234 of about 135° relative to bottom surface 223. Likewise, ridgeline 225 (formed by the intersection of second and third reflective surfaces 220 and 221) has similar angles 232 and 236 relative to top surface 226 and bottom surface 223, respectively. In addition, second and third reflective surfaces 220 and 221 are orthogonal to one another along ridgeline 225. In the exemplary embodiment, bottom surface 223 of cornercube 106 may be used as a mounting surface if desired. It should be noted, however, that it is not necessary to form top surface 226 so that the image and reflected rays are normal thereto. As such, the corner cube will redirect the incident light or transmit image of bonding tool 104 parallel to itself with an offset equal to distance 118.

The present invention can be used with light in the visible, UV and IR spectrums, and preferably with light having a wavelength that exhibits total internal reflection based on the material from which cornercube 106 is fabricated. The material selected to fabricate cornercube offset alignment tool 109 is based on the desired wavelength of light which the tool will pass. It is contemplated that cornercube offset alignment tool 109 may be fabricated to handle a predetermined range of light wavelengths between the UV (1 nm) to the near IR (3000 nm). In a preferred embodiment, the range of wavelength of light may be selected from between about i) 1 and 400 nm, ii) 630 and 690 nm, and iii) 750 and 3000 nm. Illumination may also be provided by ambient light or by the use of an artificial light source (not shown). In one exemplary embodiment, typical optical glass, having an index of refraction of 1.5 to 1.7, may be used to fabricate cornercube 106. Note, the index of refraction is based upon the material chosen for maximum transmission at the desired operating wavelength. In one embodiment, cornercube offset alignment tool 109 has an index of refraction of about 1.517.

Figure 3:
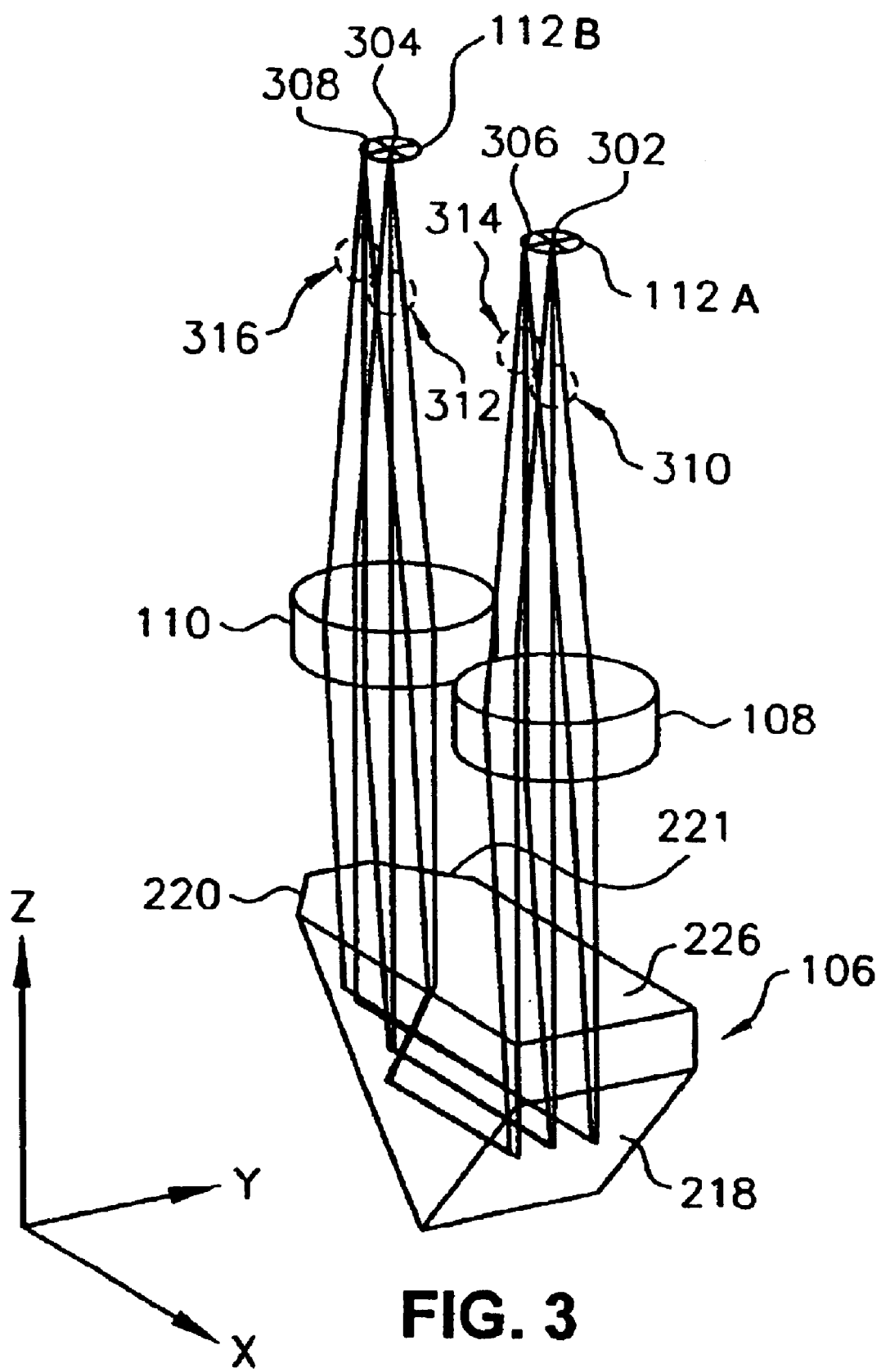
FIG. 3 is a perspective view of image ray traces according to an exemplary embodiment of the present invention.

FIG. 3 is a perspective view of image ray traces according to an exemplary embodiment of the present invention translated in a direction perpendicular to the separation of lens elements 108, 110. The same image properties shown in FIG. 2A are also evident in FIG. 3. For example, the reference position of bonding tool 104 is represented by first position 302 and its image 304 is viewed as a first direct image ray 310 which travels along first optical axis 114 through first lens element 108; passes through top surface 226 of cornercube 106; strikes first reflective surface 218 of cornercube 106; travels through cornercube 106 in a path parallel to top surface 226; strikes second reflective surface 220; strikes third reflective surface 221 before exiting the cornercube 106 through top surface 226 and travels along second optical axis 116 through second lens element 110 onto image plane 112B as ray traces 312 and viewed by imaging unit 102 at position 304. Positional displacement of bonding tool 104 is also shown in FIG. 3 and is illustrated by the path of the ray traces 314, 316 from second position 306 to second viewed position 308.

Figure 4A:
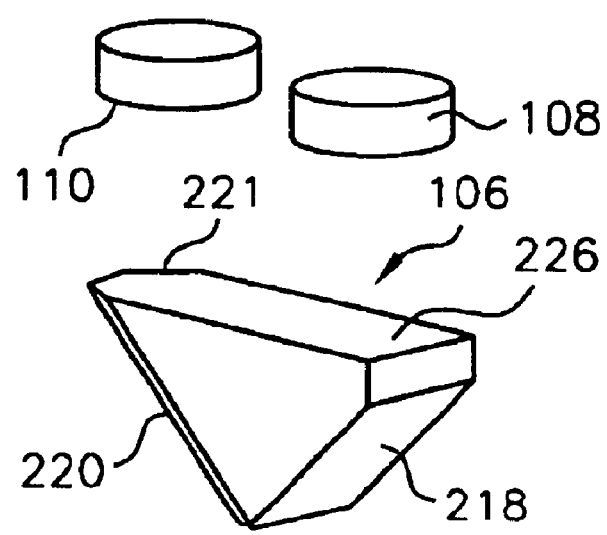
FIGS. 4A and 4B are perspective and side views, respectively, of an exemplary embodiment of the present invention.
Figure 4B:
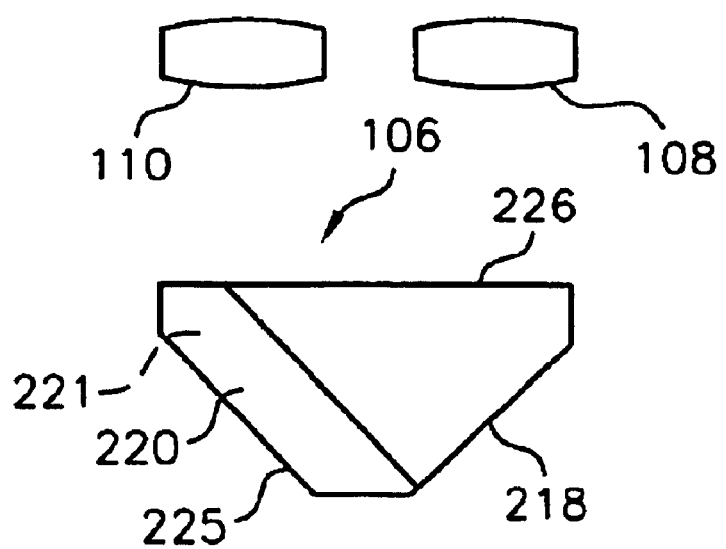

FIGS. 4A–4B are perspective and side views, respectively, of an exemplary embodiment of the present invention illustrating lens elements 108, 110 and cornercube 106. The two lens elements 108, 110 (or 205) are preferably doublets located above the cornercube 106 based on their focal distance from object plane 112A and image plane 112B, and imaginary plane 211. Doublets are preferred based on their superior optical qualities. As illustrated In FIGS. 4A–4B, an exemplary embodiment of cornercube 106 has three internal reflective surfaces, 218, 220 and 221. As shown in FIG. 4B, the exterior edges of lens elements 108, 110 and cornercube 106 are coincident with one another.

FIG. 5 illustrates the telecentricity of an exemplary embodiment of the image system of the present invention. As shown in FIG. 5, lens elements 108, 110 produce a unitary magnification and are arranged relative to cornercube 106 such that the telecentricity of the machine vision system is maintained. Note that front focal length 502 from lens element 108 to vertex 228 of cornercube 106 is equal to front focal 502 from lens element 110 to vertex 228 of cornercube 106. Note also, that back focal length 504 from lens element 108 to object plane 112A is equal to back focal length 504 from lens element 110 to image plane 112B.

FIG. 6 is a detailed view of an exemplary cornercube 106 of the present invention. Note that internal reflection surface, 218 and ridgeline 225 allow an image of bonding tool 104 to be translated in the X and Y directions. Note also, that the surfaces of cornercube 106 are preferably ground so that a reflected beam is parallel to the incident beam to within 5 arc seconds.

As shown in FIG. 6, surfaces 220 and 221 are orthogonal to one another along ridgeline 225. In addition, the angle between ridgeline 225 and surface 218 is about 90°. Furthermore, surface 218 and ridgeline form an angle of 45° relative to top surface 226 and bottom surface 223. Note also, that surfaces, 218, 220, and 221 meet to form triangular shaped bottom surface 223, which may be used to facilitate mounting of cornercube 106.

Figure 7A:
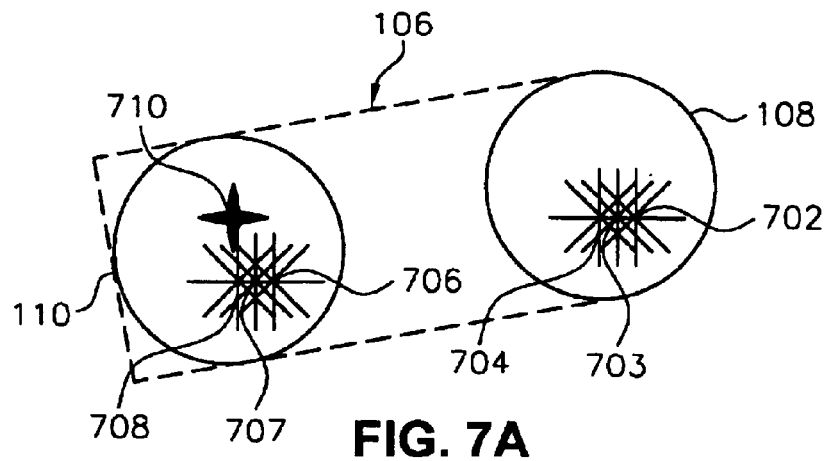
FIGS. 7A–7C illustrate the effect of tilt about the vertex of the cornercube tool of the exemplary vision system.
Figure 7B:
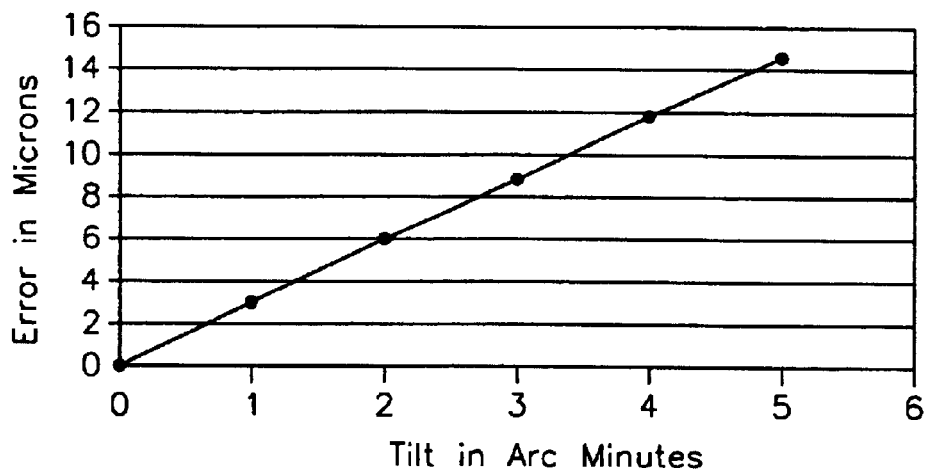
Figure 7C:
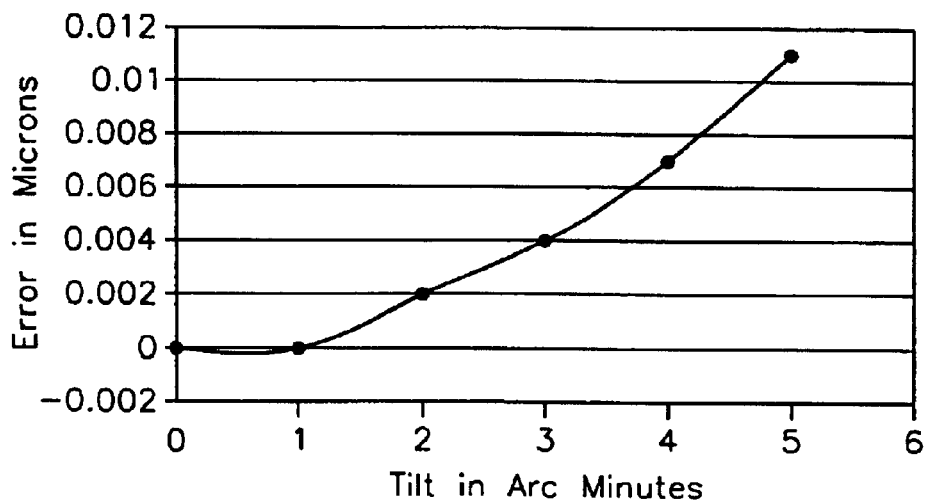

FIGS. 7A–7C illustrate the effect of tilt about the orthogonal axes of cornercube offset alignment tool 109 in an exemplary vision system. FIG. 7A is an overhead view of lens elements 108, 110 and cornercube 106. Exemplary image origins, 702, 703, 704, 706, 707, and 708 correspond to positions of image ray traces 210, 214 (shown in FIG. 2A). Note that optic axis position 710 corresponds to the position where the image of bonding tool 104 (shown in FIG. 1) would be if cornercube 106 was not tilted along the Z axis.

FIGS. 7B–7C are graphs of the effect of tilt around the Z axis in terms of tilt in arc minutes vs. error in microns. FIG. 7B shows the effect of tilt around the Z axis versus error and image location along the Y axis. FIG. 7C shows the effect of tilt around the Z axis versus error and image location along the X axis.

Figure 8B:
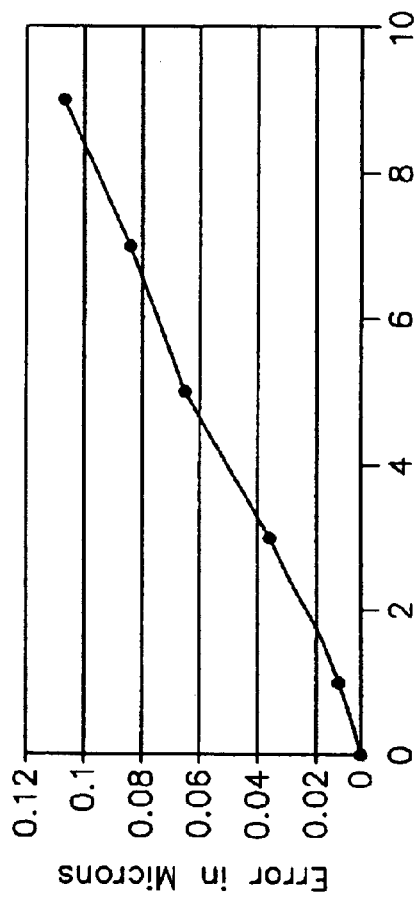
FIGS. 8A–8C illustrate the effect of tilt about the X and Y axis of the exemplary vision system.
Figure 8C:
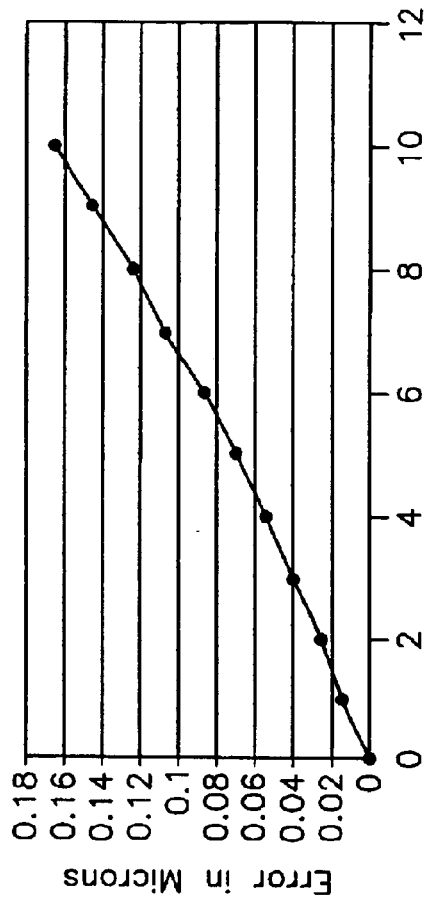
Figure 8A:
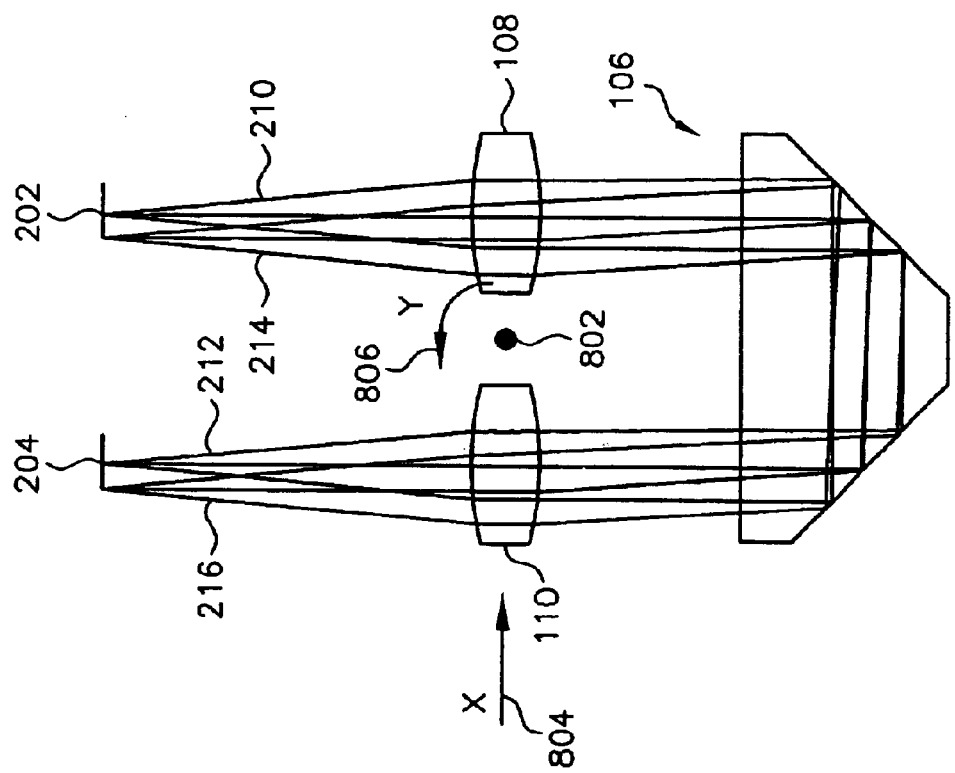

FIGS. 8A–8C illustrate the effect of tilt about the X and Y axis of the exemplary vision system. FIG. 8A is an additional side view of exemplary image ray traces 210, 212, 214, 216. In FIG. 8A, arrow 804 and dot 802 are used to depict the X and Y axes, respectively and arrow 806 depicts tilt.

FIGS. 8B–8C are graphs of the effect of tilt around the X and Y axes in terms of tilt in arc minutes vs. error in microns. FIG. 8B shows the effect of tilt around the X axis versus error and image location along the Y axis. FIG. 8C shows the effect of tilt around the Y axis versus error and image location along the X axis.

Figure 9:
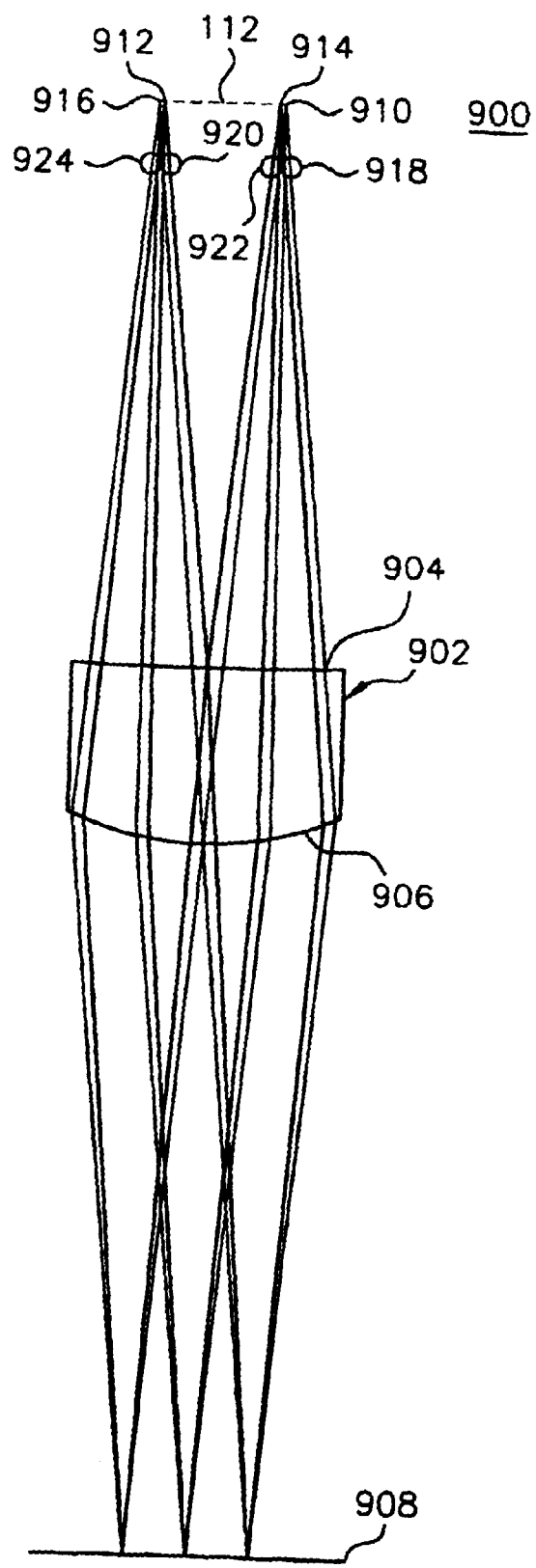
FIG. 9 is a side view of image ray traces according to a third exemplary embodiment of the present invention.

FIG. 9 is a detailed side view of image ray traces according to a third exemplary embodiment of the present invention. In FIG. 9, the reference position of bonding tool 104 is shown as a reflected ray which travels from first position 914 (on object plane 112A) along first optical axis 114 (shown in FIG. 1), as direct image ray bundle 922 from first position 914 through lens element 902. Note that in this exemplary embodiment, lens element 902 has a relatively planar, upper surface 904 and a convex lower surface 906. Direct image ray bundle 922 continues along first optical axis 114 where it then passes through upper surface 904 of lens element 902, and in turn through convex surface 906. Direct image ray bundle 922 is then reflected onto total reflective surface 908. In a preferred embodiment, total reflective surface 908 is a mirror. Next, direct image ray bundle 922 travels back through lens element 902 as reflected image ray bundle 920 along second optical axis 116 (shown in FIG. 1) and onto image plane 112B. It is reflected image ray bundle 920 that is detected by imaging unit 102 (shown in FIG. 1) as image 912. Similarly, positional displacement of bonding tool 104 is also shown in FIG. 9 and is illustrated by the path of direct image ray bundles 918, 924 from second position 910 to second viewed position 916.

Figure 10A:
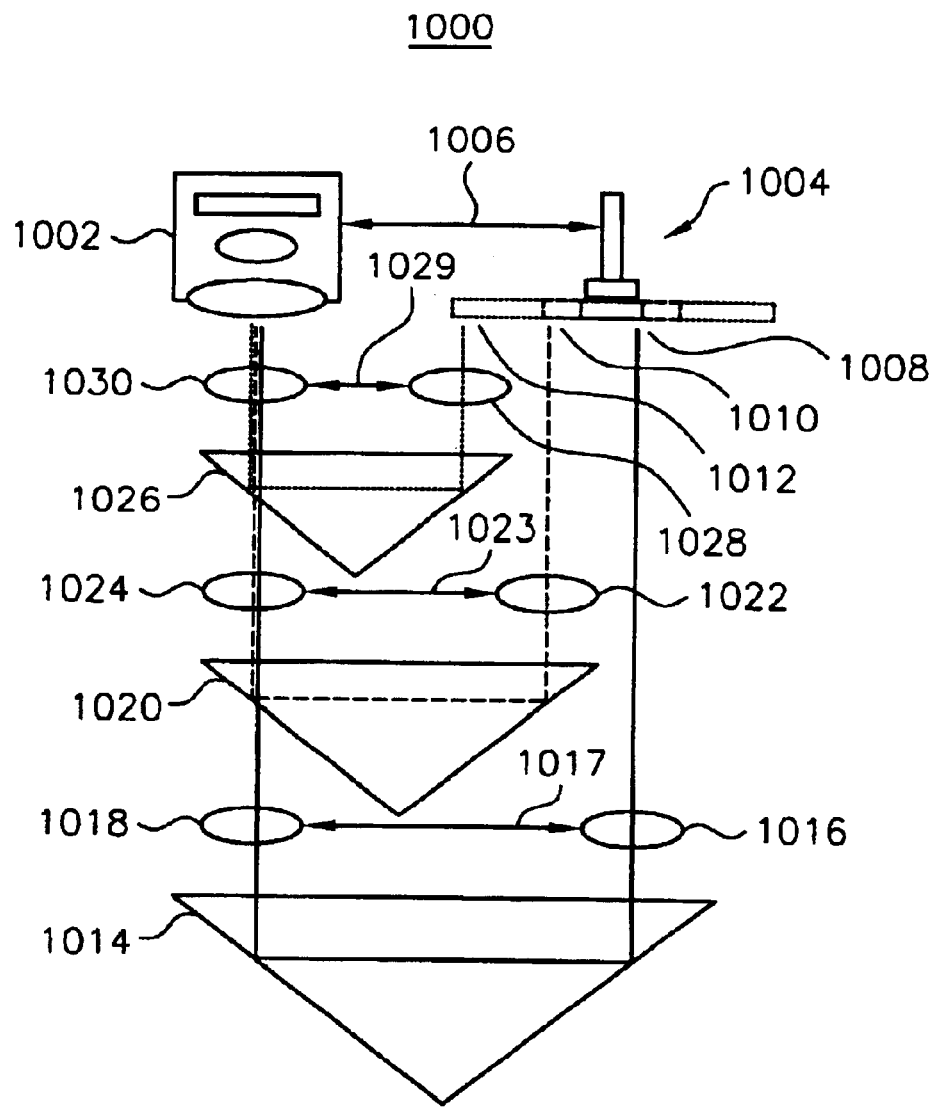
FIG. 10A is a perspective view of a fourth exemplary embodiment of the present invention.

Referring to FIG. 10A, a side view of yet another exemplary embodiment of the present invention is illustrated. In FIG. 10A, vision system 1000 comprises multiple cornercube offset tools 1014, 1020, 1026 and respective lens sets 1016/1018, 1022/1024, 1028/1030, are used as an alignment means to improve the accuracy of die attach and pick/place of assemblies, such as die 1008, 1010, 1012. This will, In effect, replace a conventional up-looking camera (i.e., a die camera—not shown) found in most conventional mid to high accuracy placement (die attach and pick/place) equipment. In the exemplary embodiment, ganged multiple cornercubes 1014, 1020, 1026 with varied lens separation distances, 1017, 1023, 1029, respectively, provide an indirect image of a location of die 1008, 1010, 1012, respectively. It is understood by those of skill in the art that only one die is viewed at a time. The use of multiple cornercube offset tool/lens combinations allows for use with a variety of different sized die. In other respects, such as the materials used, the method of reflection, etc., this exemplary embodiment is similar to the first exemplary embodiment.

As mentioned above, this variation of the first exemplary embodiment accommodates various die sizes which these types of equipment are required to accept and place. In this exemplary embodiment, down looking optical detector 1002, such as a camera, (i.e., a substrate camera) views features on the downward side of the component to be placed, such as die, 1008, 1010, or 1012. These features of die 1008, 1010, 1012, can then be identified via a vision system (not shown) to accurately place the die on the substrate (not shown) using pick tool 1004 based in part on the predetermined distance 1006 between pick/place tool 1004 and optical detector 1002. It is understood by those of skill in the art, that pick tool 1004 may be either a rotating or non-rotating pick tool. This exemplary embodiment further preserves the optical advantages with respect to accuracy of the cornercube alignment described above in the first exemplary embodiment.

Figure 10B:
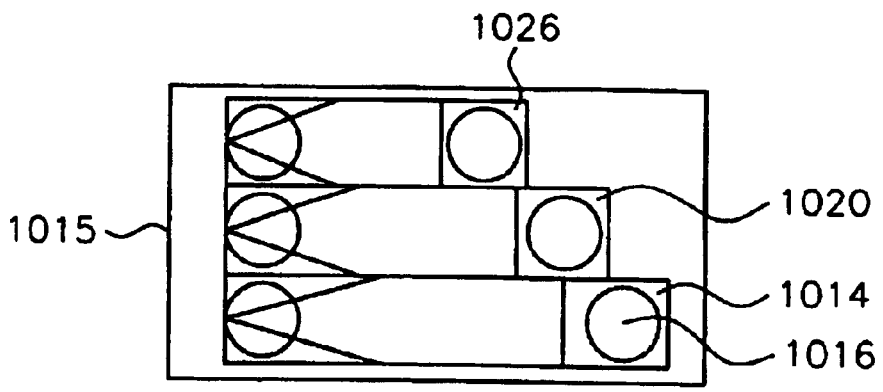
FIG. 10B is a plan view of the exemplary embodiment of FIG. 10A.

FIG. 10B is a plan view of the exemplary embodiment illustrated in FIG. 10A. In FIG. 10B, cornercube offset tools 1014, 1020, 1026 are placed adjacent one another to form assembly 1015. Cornercube offset tools 1014, 1020, 1026 may be bonded to one another, if desired using conventional adhesive means, or may be held in alignment with one another using a mechanical device, such as a clamp or a containment assembly, for example. The latter approach allowing for simple replacement of individual cornercube/lens assemblies to accommodate different sized die, as desired. Although the exemplary embodiment is shown with three cornercube offset tools, it is understood that at least two cornercube offset tools may be used.

Figure 10C:
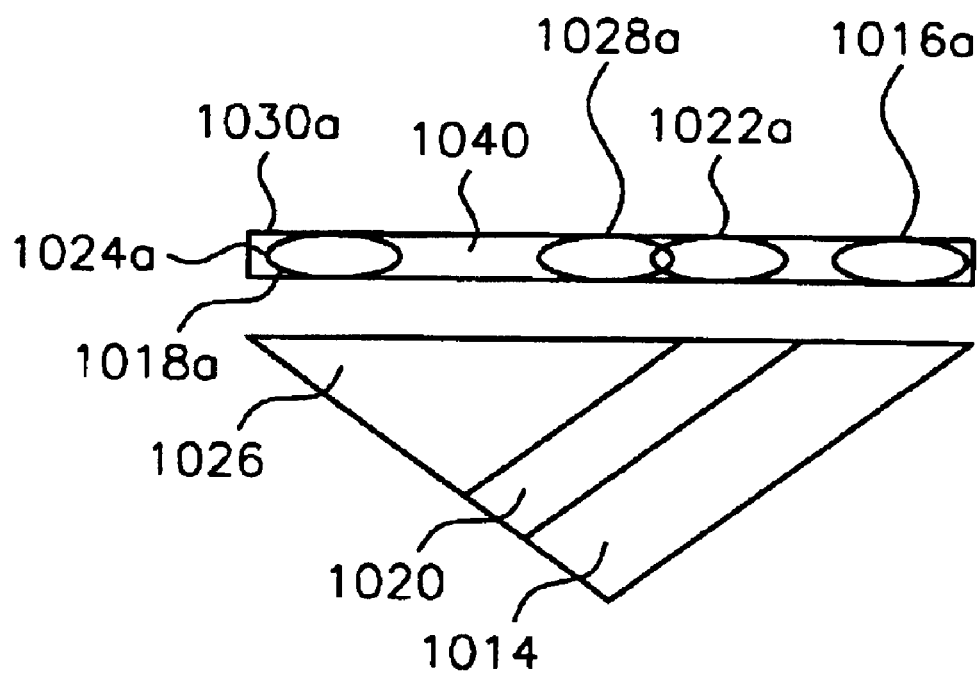
FIGS. 10C–10D are views of a lens element according to an exemplary embodiment of the present invention.
Figure 10D:
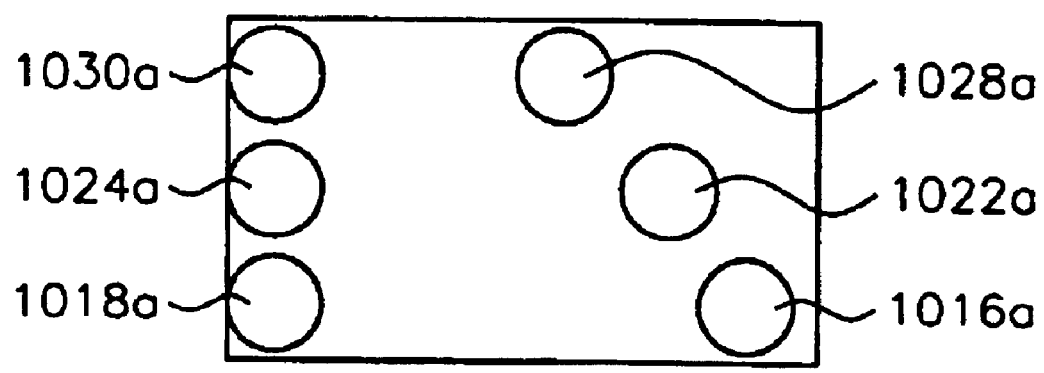
Figure 11:
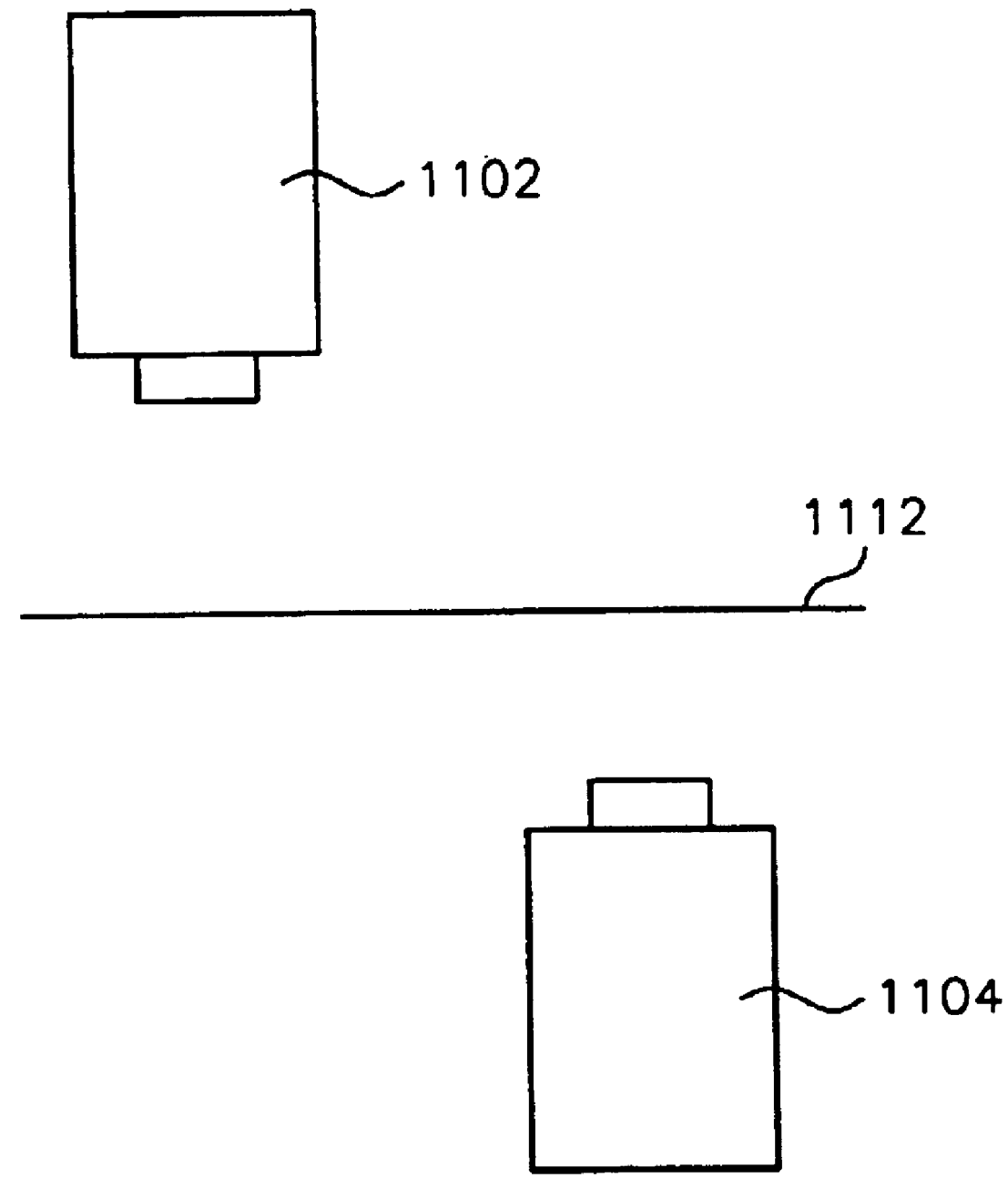
FIG. 11 is a vision system according to the prior art.

Lenses 1016, 1018, 1022, 1024, 1028, 1030 may be formed from a unitary optical member rather than individual lenses if desired to simplify assembly of the system. Such an approach is shown in FIGS. 10C–10D. As shown in FIG. 10C, lens sheet 1040 has imbedded within optical members 1016a, 1018a, 1022a, 1024a, 1028a, 1030a equivalent to individual lenses 1016, 1018, 1022, 1024, 1028, 1030.

Although the invention has been described with reference to exemplary embodiments, it is not limited thereto. Rather, the appended claims should be construed to include other variants and embodiments of the invention, which may be made by those skilled in the art without departing from the true spirit and scope of the present invention.

What is claimed:

1. A method for positioning a die on a substrate, the method comprising the steps of:

providing a cornercube offset tool below an object plane of the substrate, the cornercube offset tool having three internal reflection surfaces;

viewing an indirect image of the die through the cornercube offset tool;

identifying a feature located on a bottom surface of the die based on the indirect image; and placing the die on the substrate based on the identified feature.

2. A method for positioning a die on a substrate, the method comprising the steps of:

positioning a plurality of cornercube offset tools below an object plane of the substrate;

positioning a first lens between each of the plurality of cornercube offset tools and the die;

positioning a second lens between each of the plurality of cornercube offset tools and an optical input device; and viewing a surface of the die through the first lens, the cornercube offset tool, and the second lens.

3. A method for use with a bonding machine to place a die on a substrate, the method comprising the steps of:

positioning a cornercube offset tool below an object plane of the bonding machine;

positioning a lens between i) the vision plane and the cornercube offset tool and ii) between an optical input device and the cornercube offset tool;

viewing a portion of a bottom surface of the die through the cornercube offset tool and the lens; and placing the die on the substrate based on the viewed portion of the die.

* * * * *